United States Patent
Wu et al.

(10) Patent No.: US 7,397,086 B2
(45) Date of Patent: *Jul. 8, 2008

(54) TOP-GATE THIN-FILM TRANSISTOR

(75) Inventors: Yiliang Wu, Mississauga (CA); Beng S. Ong, Mississauga (CA); Paul F. Smith, Oakville (CA)

(73) Assignee: Xerox Corporation, Norwalk, CT (US)

( * ) Notice: Subject to any disclaimer, the term of this patent is extended or adjusted under 35 U.S.C. 154(b) by 3 days.

This patent is subject to a terminal disclaimer.

(21) Appl. No.: 11/317,168

(22) Filed: Dec. 23, 2005

(65) Prior Publication Data

US 2007/0145371 A1    Jun. 28, 2007

(51) Int. Cl.
*H01L 29/76* (2006.01)

(52) U.S. Cl. .......................... 257/347; 257/288; 257/40; 257/233; 257/E29.151; 257/E29.273; 257/E29.314

(58) Field of Classification Search ................ 257/347, 257/288, 289, 40, 233, E29.151, E29.273, 257/E29.314

See application file for complete search history.

(56) References Cited

U.S. PATENT DOCUMENTS

| | | | |
|---|---|---|---|
| 6,952,036 B2 * | 10/2005 | Suzuki et al. | 257/347 |
| 2004/0129937 A1 * | 7/2004 | Hirai | 257/40 |
| 2004/0129978 A1 * | 7/2004 | Hirai | 257/347 |
| 2005/0051780 A1 * | 3/2005 | Ando et al. | 257/72 |
| 2005/0211975 A1 * | 9/2005 | Kawasaki et al. | 257/40 |
| 2005/0285102 A1 * | 12/2005 | Koo et al. | 257/40 |
| 2006/0220126 A1 * | 10/2006 | Huisman et al. | 257/347 |
| 2007/0012914 A1 * | 1/2007 | Miura et al. | 257/40 |

* cited by examiner

*Primary Examiner*—Wai-Sing Louie
*Assistant Examiner*—Marc Armand
(74) *Attorney, Agent, or Firm*—Eugene O. Palazzo; Fay Sharpe LLP

(57) ABSTRACT

A thin-film transistor, such as a top-gate thin-film transistor, is provided herein. The thin-film transistor has a performance-enhancing layer, such as a performance-enhancing bottom layer, comprising a polymer other than a polyimide. In specific embodiments, the polymer is selected from the group consisting of polysiloxane, polysilsesquioxane, and mixtures thereof. In other embodiments, it is a self-assembling polymeric monolayer of a silane agent and an organophosphonic acid. The performance-enhancing layer directly contacts the substrate. The layer improves the carrier mobility and current on/off ratio of the thin film transistor.

7 Claims, 1 Drawing Sheet

TOP-GATE THIN-FILM TRANSISTOR

STATEMENT REGARDING FEDERALLY SPONSORED RESEARCH

This development was made with United States Government support under Cooperative Agreement No. 70NANBOH3033 awarded by the National Institute of Standards and Technology (NIST). The United States Government has certain rights in the development.

CROSS-REFERENCE TO RELATED APPLICATIONS

This application relates to U.S. patent application Ser. No. 11/318,044, filed Dec. 23, 2005, and to U.S. patent application Ser. No. 11/317,746, filed Dec. 23, 2005; these disclosures are hereby incorporated by reference in their entirety.

BACKGROUND

The present disclosure relates, in various embodiments, to compositions suitable for use in electronic devices, such as thin film transistors ("TFT"s). The present disclosure also relates to layers produced using such compositions and electronic devices containing such layers.

Thin film transistors (TFTs) are fundamental components in modern-age electronics, including, for example, sensors, image scanners, and electronic display devices. TFT circuits using current mainstream silicon technology may be too costly for some applications, particularly for large-area electronic devices such as backplane switching circuits for displays (e.g., active matrix liquid crystal monitors or televisions) where high switching speeds are not essential. The high costs of silicon-based TFT circuits are primarily due to the use of capital-intensive silicon manufacturing facilities as well as complex high-temperature, high-vacuum photolithographic fabrication processes under strictly controlled environments. It is generally desired to make TFTs which have not only much lower manufacturing costs, but also appealing mechanical properties such as being physically compact, lightweight, and flexible.

TFTs are generally composed of a supporting substrate, three electrically conductive electrodes (gate, source and drain electrodes), a channel semiconductor layer, and an electrically insulating gate dielectric layer separating the gate electrode from the semiconductor. The channel semiconductor is in turn in contact with the source and drain electrodes. The materials used to make the TFTs, and the interfacial properties between various layers of semiconductor, dielectric, and electrodes will affect the performance of the TFTs. Accordingly, a great deal of recent effort has been devoted to improving the TFT device performance through new materials design, optimization of interfaces, etc.

The interface between the dielectric layer and the organic semiconductor layer critically affects the performance of the TFT. The surface of the dielectric layer has been previously modified (forming a dielectric/semiconductor interfacial layer) to improve its compatibility with the semiconductor layer. Modifying the dielectric layer is difficult in a top-gate TFT structure where the semiconductor layer is deposited prior to the dielectric layer. However, a top-gate structure is preferred for many applications. Therefore, there is a need of layer, which is rather than the dielectric/semiconductor interfacial layer, to improve the device performance of a top-gate TFT.

BRIEF DESCRIPTION

The present disclosure is directed, in various exemplary embodiments, to a thin film transistor, such as a top-gate thin-film transistor, having a performance-enhancing layer, such as a performance-enhancing bottom layer. In specific embodiments, the performance-enhancing bottom layer comprises a polymer selected from the group consisting of polysiloxane, polysilsesquioxane, polystyrene, poly(α-methyl styrene), and mixtures thereof.

In further specific embodiments, the polymer is selected from the group consisting of polysiloxane, polysilsesquioxane, and mixtures thereof.

In another embodiment, the performance-enhancing bottom layer is a self-assembled monolayer made from silane agents and organophosphonic acid.

In another embodiment, the performance-enhancing bottom layer comprises a non-polyimide polymer.

These and other non-limiting characteristics of the exemplary embodiment of the present disclosure are more particularly described below.

BRIEF DESCRIPTION OF THE DRAWINGS

The following is a brief description of the drawings, which are presented for the purpose of illustrating the exemplary embodiments disclosed herein and not for the purpose of limiting the same.

DETAILED DESCRIPTION

Figure 1:
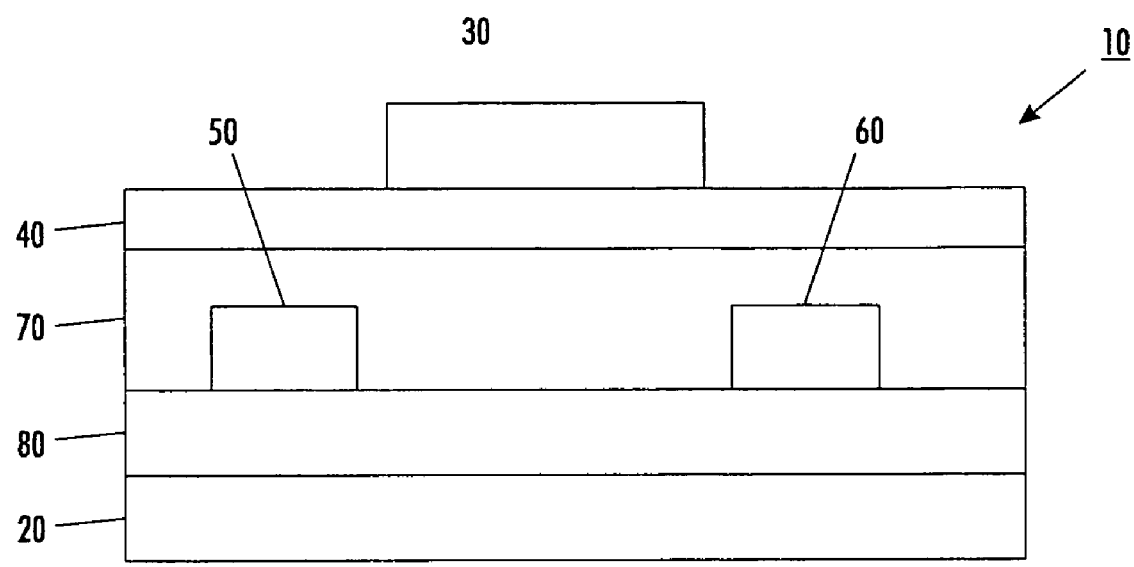
FIG. 1 is a first exemplary embodiment of a TFT having a performance-enhancing bottom layer according to the present disclosure.

A more complete understanding of the components, processes, and apparatuses disclosed herein can be obtained by reference to the accompanying figures. These figures are merely schematic representations based on convenience and the ease of demonstrating the present development and are, therefore, not intended to indicate relative size and dimensions of the devices or components thereof and/or to define or limit the scope of the exemplary embodiments.

Although specific terms are used in the following description for the sake of clarity, these terms are intended to refer only to the particular structure of the embodiments selected for illustration in the drawings and are not intended to define or limit the scope of the disclosure. In the drawings and the following description below, it is to be understood that like numeric designations refer to components of like function.

FIG. 1 illustrates a first exemplary embodiment of a TFT configuration. This is a top-gate configuration, wherein the gate electrode 30 and the dielectric layer 40 form the top and outermost layers of the TFT. The TFT 10 comprises a substrate 20 in contact with the performance-enhancing bottom layer 80. The source electrode 50 and the drain electrode 60 both contact the semiconductor layer 70. The semiconductor layer 70 also contacts the performance-enhancing bottom layer 80. The dielectric layer 40 separates the gate electrode 30 from the source electrode 50, drain electrode 60, and the semiconductor layer 70.

Figure 2:
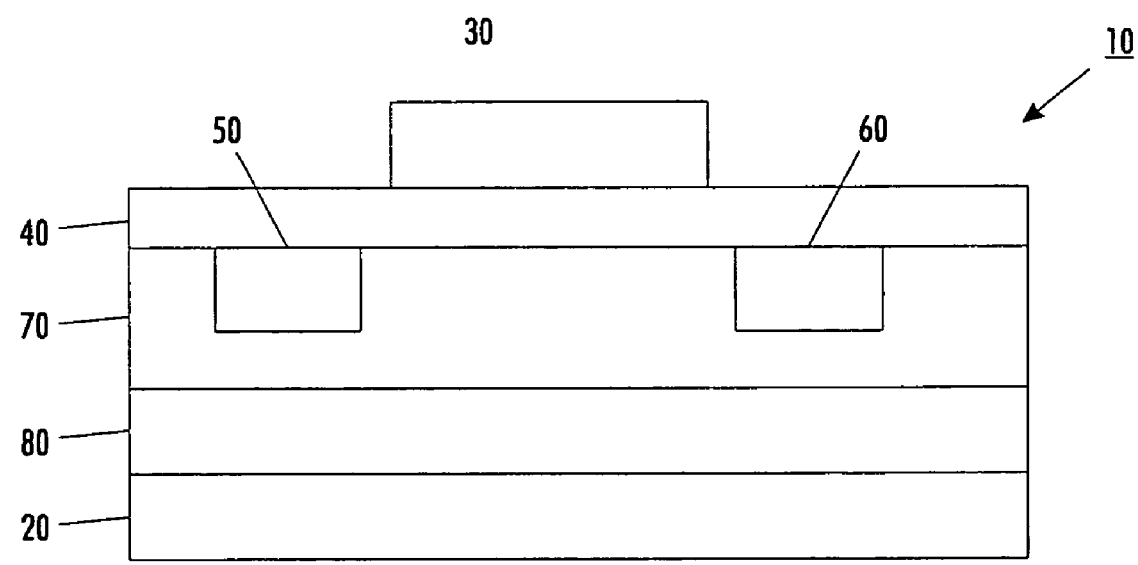
FIG. 2 is a second exemplary embodiment of a TFT having a performance-enhancing bottom layer according to the present disclosure.

FIG. 2 illustrates a second exemplary embodiment of a TFT configuration. The only difference is that here, the source electrode 50 and drain electrode 60 are separated from the performance-enhancing bottom layer 80 by the semiconductor layer 70.

In the exemplary embodiments, the terms "top" layer and "bottom" layer refer to location of the layer respective to the semiconductor channel layer (the semiconductor layer located in the TFT channel). A layer that is on top of, directly or indirectly, the semiconductor channel layer is considered as a top layer. For example, top-gate indicates that a gate electrode is on top of the semiconductor channel layer. A layer is under, directly or indirectly, the semiconductor channel layer is considered as a bottom layer. For example, performance-enhancing bottom layer is under the semiconductor layer. The terms "performance-enhancing" refers to improvement of the TFT performance such as mobility, current on/off ratio. In the embodiments, by applying a performance-enhancing layer at the bottom of a semiconductor layer of a TFT, the performance of the TFT is improved in terms of mobility and/or current on/off ratio.

The semiconductor layer always contacts the performance-enhancing bottom layer in order to give high performance to the device. In other embodiments, the performance-enhancing bottom layer is located between the substrate and the semiconductor layer and may be distinguished from the substrate by its different chemical composition. The performance-enhancing bottom layer is separated from the dielectric layer by, at a minimum, the semiconductor layer in the channel region.

This disclosure also contemplates TFTs which have this performance-enhancing bottom layer and electronic devices, such as light emitting diodes or display monitors, which use such TFTs. TFTs incorporating the performance-enhancing bottom layer have shown high field-effect carrier mobility and high current on/off ratio. The performance-enhancing bottom layer has a thickness of from about 0.5 nanometers (nm) to about 10 micrometers (μm).

The performance-enhancing bottom layer of the present disclosure may comprise a polymer which is other than a polyimide. In embodiments, the performance-enhancing bottom layer comprise a polymer selected from the group consisting of polysiloxane, polysilsesquioxane, polystyrene, poly(α-methyl styrene), and mixtures thereof. In further specific embodiments, the polymer is selected from the group consisting of polysiloxane, polysilsesquioxane, and mixtures thereof. Polysiloxanes have a chemical structure as shown in Formula (I) below:

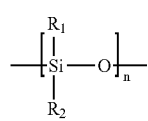

Formula (I)

wherein $R_1$ and $R_2$ are independently selected from alkyl, alkenyl, aryl, arylalkyl, and hydrogen; wherein $R_1$ and $R_2$ may further contain a heteroatom selected from the group consisting of oxygen, sulfur, and nitrogen; and wherein n is the degree of polymerization. In one embodiment, the $R_1$ and $R_2$ are independently selected from $C_1$-$C_{40}$ aliphatic, $C_4$-$C_{40}$ alicyclic, $C_7$-$C_{40}$ arylalkyl, $C_6$-$C_{20}$ aryl, and a combination thereof. In embodiments, n is from about 4 to about 10,000. In further embodiments, n is from about 10 to about 5,000.

Polysilsesquioxanes have a chemical structure as shown in Formula (II) below:

 (II)

wherein the Rs, which can be the same or different from each other, are independently selected from alkyl, alkenyl, aryl, arylalkyl, and hydrogen; wherein Rs may further contain a heteroatom selected from the group consisting of oxygen, sulfur, and nitrogen; and wherein n is the degree of polymerization. In one embodiment, the Rs are independently selected from $C_1$-$C_{40}$ aliphatic, $C_4$-$C_{40}$ alicyclic, $C_7$-$C_{40}$ arylalkyl, $C_6$-$C_{20}$ aryl, and a combination thereof. In embodiments, n is from about 2 to about 10,000. In further embodiments, n is from about 5 to about 5,000. In specific embodiments, the Rs are the same. IN some specific embodiments, the polymer is poly(methyl silsesquioxane).

Polysiloxanes and polysilsesquioxanes have several characteristics which make them suitable for use in TFTs. They are very compatible with semiconductor materials; in particular, p-type semiconductors such as polythiophenes and pentacenes. The term "compatible" refers to how well the semiconductor layer can perform electrically when it is deposited on the surface of the performance-enhancing layer. For example, a hydrophobic surface is generally preferred for polythiophene semiconductors. Polysiloxanes and polysilsesquioxanes can also be cured at a relatively low temperature such as below 200° C. They are also compatible with plastic materials such as MYLAR and thus suitable for use in flexible integrated circuits. Finally, they are reasonably soluble in common organic solvents and thus lend themselves to solution processes such as spin coating, dip coating, and printing. In embodiments where the bottom layer comprises a polymer selected from the group consisting of polysiloxane, polysilsesquioxane, polystyrene, poly(α-methyl styrene), and mixtures thereof will have a thickness of from about 5 nanometers to about 10 micrometers.

The performance-enhancing bottom layer can be applied using known methods. It is generally applied via liquid deposition, wherein the polymer is dissolved in a common organic solvent such as water, alcohol, ketone, ether, toluene, phenol, DMF, or THF. This solution is then applied to the thin film transistor. After the solvent is removed, the performance-enhancing bottom layer is left behind on the transistor. Other methods such as sputtering, coating, and vacuum evaporation coating may also be used to deposit the layer. The layer may be patterned at the required position for each TFT or it may be continuous and cover the whole surface of the substrate.

In another embodiment, the performance-enhancing bottom layer is a self-assembling monolayer (SAM). The SAM may be formed from a precursor having the following formula:

wherein X is a reactive group with can react with certain functional group(s) on substrate surface, and Y is a linear or branched hydrocarbon or heteroatom-containing group having 1 to about 60 carbon atoms or from 1 to about 30 carbon atoms. In embodiments, X is selected from the groups consisting of —$PO_3H_3$, —$OPO_3H_3$, —COOH, —$SiCl_3$, —$SiCl(CH_3)_2$, —$SiCl_2CH_3$, —$Si(OCH_3)_3$, —$SiCl_3$, —$Si(OC_2H_5)_3$, —OH, —SH, —CONHOH, —NCO, and benzotriazolyl (—$C_6H_4N_3$), and the like. In one embodiment, the precursor is a silane agent, such as mono-, di-, and trichlorosilane for example octyltrichlorosilane. In another embodiment, the precursor is an organophosphonic acid (such as 1-phosphonohexadecane). The monolayer is applied using known methods. In embodiments where the bottom layer comprises a self-assembling monolayer, it has a thickness of from about 0.5 to about 5 nanometers.

In another embodiment, the performance-enhancing bottom layer may comprise any polymer other than a polyimide. In other words, the bottom layer comprises a non-polyimide base polymer.

The performance-enhancing bottom layer has a surface roughness of less than about 10 nm. In other embodiments, it has a surface roughness of less than about 5 nm. In embodiment, a smooth surface is preferred. The performance-enhancing bottom layer has a hydrophobic surface. This surface property can be characterized by measuring advancing water contact angle of the surface. In embodiment, the surface water contact angle is greater than about 80 degrees, greater than about 90 degrees, greater than about 95 degrees.

As previously mentioned, TFTs generally comprise a supporting substrate, three electrically conductive electrodes (gate, source and drain electrodes), a channel semiconductor layer, and an electrically insulating gate dielectric layer separating the gate electrode from the semiconductor. TFTs according to the present disclosure further comprise a performance-enhancing bottom layer. The other layers and their composition/manufacture are discussed below.

The substrate may be composed of materials including but not limited to silicon, glass plate, plastic film or sheet. For structurally flexible devices, plastic substrate, such as for example polyester, polycarbonate, polyimide sheets and the like may be used. The thickness of the substrate may be from about 10 micrometers to over 10 millimeters with an exemplary thickness being from about 50 micrometers to about 5 millimeters, especially for a flexible plastic substrate and from about 0.5 to about 10 millimeters for a rigid substrate such as glass or silicon.

The gate electrode is composed of an electrically conductive material. It can be a thin metal film, a conducting polymer film, a conducting film made from conducting ink or paste or the substrate itself, for example heavily doped silicon. Examples of gate electrode materials include but are not restricted to aluminum, gold, chromium, indium tin oxide, conductive polymers such as polystyrene sulfonate-doped poly(3,4-ethylenedioxythiophene) (PSS-PEDOT), and conducting ink/paste comprised of carbon black/graphite. The gate electrode can be prepared by vacuum evaporation, sputtering of metals or conductive metal oxides, conventional lithography and etching, chemical vapor deposition, spin coating, casting or printing, or other deposition processes. The thickness of the gate electrode ranges from about 10 to about 500 nanometers for metal films and from about 0.5 to about 10 micrometers for conductive polymers.

The dielectric layer generally comprises an inorganic material film, an organic polymer film, or an organic-inorganic composite film. Examples of inorganic materials suitable as the dielectric layer include silicon oxide, silicon nitride, aluminum oxide, barium titanate, barium zirconium titanate and the like. Examples of suitable organic polymers include polyesters, polycarbonates, poly(vinyl phenol), polyimides, polystyrene, polymethacrylates, polyacrylates, epoxy resin and the like. The thickness of the dielectric layer depends on the dielectric constant of the material used and can be, for example, from about 10 nanometers to about 500 nanometers. The dielectric layer may have a conductivity that is, for example, less than about $10^{-12}$ Siemens per centimeter (S/cm). The dielectric layer is formed using conventional processes known in the art, including those processes described in forming the gate electrode.

The semiconductor layer generally is an organic semiconducting material. Examples of organic semiconductors include but are not limited to acenes, such as anthracene, tetracene, pentacene, and their substituted derivatives, perylenes, fullerenes, oligothiophenes, polythiophenes and their substituted derivatives, polypyrrole, poly-p-phenylenes, poly-p-phenylvinylidenes, naphthalenedicarboxylic dianhydrides, naphthalene-bisimides, polynaphthalenes, phthalocyanines such as copper phthalocyanines or zinc phthalocyanines and their substituted derivatives. In particular, polythiophenes may be used in the transistors of the present disclosures. The polythiophene may be selected from the group consisting of regioregular and regiorandom poly(3-alkylthiophene)s, polythiophenes comprising substituted and unsubstituted thienylene groups, polythiophenes comprising optionally substituted thieno[3,2-b]thiophene and/or optionally substituted thieno[2,3-b]thiophene groups, and polythiophenes comprising non-thiophene based aromatic groups. In one exemplary embodiment, the semiconductor used is a p-type semiconductor. In another exemplary embodiment, the semiconductor is a liquid crystalline semiconductor. The semiconductor layer is from about 5 nm to about 1000 nm thick. The semiconductor layer can be formed by molecular beam deposition, vacuum evaporation, sublimation, blade coating, rod coating, screen printing, stamping, ink jet printing, spin-on coating, dip coating, and the like, and other conventional processes known in the art, including those processes described in forming the gate electrode.

The source and drain electrodes can be fabricated from materials which provide a low resistance ohmic contact to the semiconductor layer. Typical materials suitable for use as source and drain electrodes include those of the gate electrode materials such as gold, nickel, aluminum, platinum, conducting polymers, and conducting inks. Typical thicknesses are about, for example, from about 40 nanometers to about 1 micrometer with a more specific thickness being about 100 to about 400 nanometers. The TFTs of the present disclosure contain a semiconductor channel. The semiconductor channel width may be, for example, from about 10 micrometers to about 5 millimeters with a specific channel width being about 100 micrometers to about 1 millimeter. The semiconductor channel length may be, for example, from about 1 micrometer to about 1 millimeter with a more specific channel length being from about 5 micrometers to about 100 micrometers.

The source electrode is grounded and a bias voltage of generally, for example, about 0 volt to about 80 volts is applied to the drain electrode to collect the charge carriers transported across the semiconductor channel when a voltage of generally, for example, about +10 volts to about −80 volts is applied to the gate electrode. The electrodes may be formed or deposited using conventional processes known in the art.

The various components of the TFT may be deposited upon the substrate in any order, as is seen in the Figures. The term "upon the substrate" should not be construed as requiring that each component directly contact the substrate. The term should be construed as describing the location of a component relative to the substrate. However, the gate electrode and the semiconductor layer should both be in direct contact with the dielectric layer. Also, the performance-enhancing bottom layer always contacts the substrate. In addition, the source and drain electrodes should both be in contact with the semiconductor layer.

While particular embodiments have been described, alternatives, modifications, variations, improvements, and substantial equivalents that are or may be presently unforeseen may arise to applicants or others skilled in the art. Accordingly, the appended claims as filed and as they may be amended are intended to embrace all such alternatives, modifications variations, improvements, and substantial equivalents.

The invention claimed is:

1. A top-gate thin film transistor comprising, in sequence:
a substrate having functional groups on its surface;
a performance-enhancing bottom layer;
a semiconductor layer; and
a dielectric layer;
wherein the performance-enhancing bottom layer is positioned between the substrate and the semiconductor layer; and,
wherein the performance-enhancing bottom layer is a self-assembling monolayer formed from a precursor having the following formula:

X—Y wherein X is a group that is reactive with the functional groups on the substrate surface, and Y is a linear or branched hydrocarbon or heteroatom-containing group having 1 to about 60 carbon atoms or from 1 to about 30 carbon atoms; and wherein X is selected from the groups consisting of —$PO_3H_3$, —$SiCl_3$, —$SiCl(CH_3)_2$, and —$SiCl_2CH_3$.

2. The thin film transistor of claim 1, wherein the precursor is 1-phosphonohexadecane.

3. The thin film transistor of claim 1, wherein the performance-enhancing bottom layer has a thickness of from about 0.5 nanometers to about 5 nanometers.

4. The thin film transistor of claim 1, wherein the semiconductor layer comprises a polythiophene.

5. The thin film transistor of claim 1, wherein the performance-enhancing bottom layer has a surface roughness of less than about 10 nanometers.

6. The thin film transistor of claim 1, wherein the performance-enhancing bottom layer has a surface water contact angle greater than about 80 degrees.

7. The thin film transistor of claim 5, wherein the performance-enhancing bottom layer has a surface roughness of less than about 5 nanometers.

* * * * *

UNITED STATES PATENT AND TRADEMARK OFFICE
CERTIFICATE OF CORRECTION

PATENT NO. : 7,397,086 B2
APPLICATION NO. : 11/317168
DATED : July 8, 2008
INVENTOR(S) : Yiliang Wu et al.

It is certified that error appears in the above-identified patent and that said Letters Patent is hereby corrected as shown below:

In the Specification

Column 1, lines 7 and 8, after "Cooperative Agreement No.", please delete "70NANBOH3033" and insert --70NANB0H3033--.

Signed and Sealed this
Third Day of September, 2013

Teresa Stanek Rea
*Acting Director of the United States Patent and Trademark Office*